United States Patent
Balantrapu et al.

(10) Patent No.: US 10,583,459 B2
(45) Date of Patent: Mar. 10, 2020

(54) IMAGING THREE DIMENSIONAL SUBSTRATES USING A TRANSFER FILM

(71) Applicant: Rohm and Haas Electronic Materials LLC, Marlborough, MA (US)

(72) Inventors: Krishna Balantrapu, Cambridge, MA (US); Robert K. Barr, Shrewsbury, MA (US); Brian D. Amos, Worcester, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 935 days.

(21) Appl. No.: 14/141,488

(22) Filed: Dec. 27, 2013

(65) Prior Publication Data

US 2015/0182997 A1 Jul. 2, 2015

(51) Int. Cl.
| | |
|---|---|
| B05D 7/24 | (2006.01) |
| G03F 7/20 | (2006.01) |
| G03F 7/18 | (2006.01) |

(52) U.S. Cl.
CPC ............... B05D 7/24 (2013.01); G03F 7/18 (2013.01); G03F 7/2018 (2013.01); B05D 2502/005 (2013.01)

(58) Field of Classification Search
CPC ........... G03F 7/2018; G03F 7/18; G03F 7/161
See application file for complete search history.

(56) References Cited

U.S. PATENT DOCUMENTS

| | | | | |
|---|---|---|---|---|
| 3,526,504 A | * | 9/1970 | Celeste | G03F 7/346 |
| | | | | 156/233 |
| 4,451,329 A | * | 5/1984 | Batchelor | B44C 1/227 |
| | | | | 216/31 |
| 8,252,506 B2 | | 8/2012 | Cheetham et al. | |
| 2010/0129754 A1 | * | 5/2010 | Cheetham | C09D 11/101 |
| | | | | 430/286.1 |
| 2011/0291330 A1 | | 12/2011 | Despa et al. | |

FOREIGN PATENT DOCUMENTS

| | | |
|---|---|---|
| CN | 101121348 A | 2/2008 |
| EP | 1457823 A2 | 9/2004 |
| EP | 1524553 A2 | 4/2005 |
| EP | 2432035 A2 | 3/2012 |

OTHER PUBLICATIONS

European Extended Search Report for corresponding European Application No. 14 20 0402, dated May 28, 2015.
Search report from corresponding Taiwan 103146020 application, dated Apr. 7, 2016.
Search report for corresponding China Application No. 201410858492.8 dated May 9, 2018.
Search report for corresponding China Application No. 201410858492.8 dated Aug. 8, 2019.

* cited by examiner

Primary Examiner — Matthew J Daniels
(74) Attorney, Agent, or Firm — John J. Piskorski

(57) ABSTRACT

Actinic radiation curable inks are selectively applied to flexible films which allow the transmission of actinic radiation and then are applied such that the side of the flexible films on which the curable inks are applied contact surfaces of three dimensional substrates. Actinic radiation is applied to the flexible films which cause the ink to cure on the three dimensional substrate. The flexible films are removed leaving the cured ink on the substrates.

12 Claims, 1 Drawing Sheet

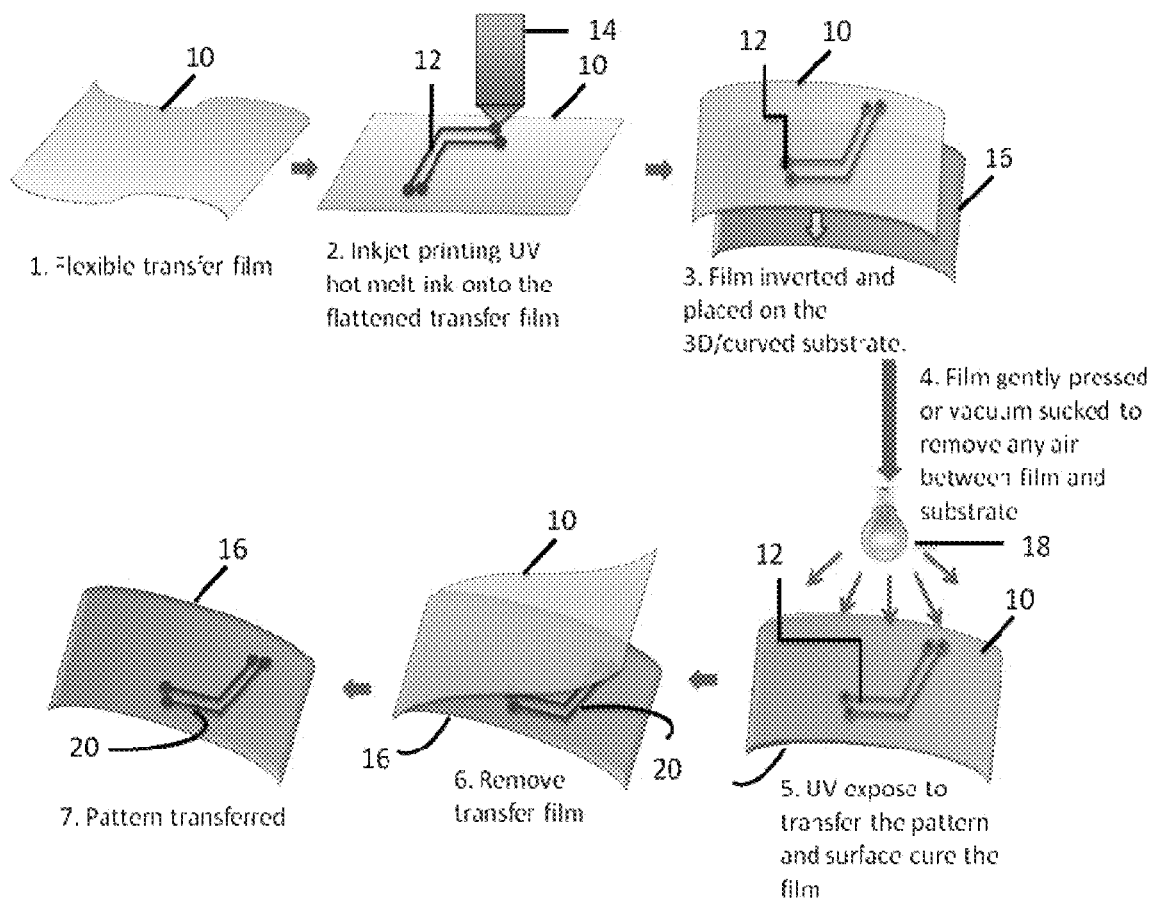

IMAGING THREE DIMENSIONAL SUBSTRATES USING A TRANSFER FILM

FIELD OF THE INVENTION

The present invention is directed to forming images on three dimensional substrates by inkjet printing with actinic radiation curable resist compositions using a transfer film. More specifically, the present invention is directed to forming images on three dimensional substrates by inkjet printing with actinic radiation curable resist compositions using a transfer film that is efficient and where the images have improved resolution.

BACKGROUND OF THE INVENTION

Some substrates have three dimensional surfaces where imaging is challenging. For example, in the gravure printing industry a unique image carrier, which is usually made of a steel or aluminum based cylinder is used. The cylinder is electroplated with copper and then etched chemically or engraved electromechanically such that print areas are below the surface of the cylinder. In the image areas, there are thousands of micro size cells to be etched or engraved into the cylinder.

In the chemical etching process, the cylinder is coated with a light sensitive emulsion of photoresist. A photo graphic art work film is placed in direct contact with the photoresist coating. The photoresist is then exposed with ultraviolet light projected through the photo graphic film. The cylinder is then developed with water or water based chemicals, rinsed from the surface to carry away the unexposed material leaving a rigid, hard-edged resist. The cells develop cleanly and leave exposed copper metal where the resist is removed. The next step is a chemical etching process to etch away the exposed copper. Although the process is widely used in imaging gravure cylinders, it is tedious, expensive and wasteful of materials.

Another process, electromechanical engraving, is very popular today. The physical process of cutting the cells is done on a specially built metal lathe designed to cut a fixed pattern of very small diamond shaped holes into a copper cylinder in a uniform manner. An engraving head controls the pattern of cells and the cell size. High quality bearings and a unique drive mechanism on the bed of the engraver control the uniform motions of the cylinder's rotation and the lateral movement of the engraving head carriage. However, the processing times for cylinders using this technique can last for days depending on the combination of cylinder size and cell size.

Laser engraving is another method used to image the cylinder where computer-directed lasers, which, like the electromechanical method, cut cells of varying depths and sizes. The original is scanned into a computer, the various image densities are determined, and lasers etch the cylinder. This method has limitations due to the difficulty in forming images due to the high light reflectance of copper and the complexity of the process.

In the past, printing techniques have also been proposed and put in practical use for forming images on three dimensional (3D) objects such as the cylinders. Of these printing methods, ink jet printing was preferred owing to its high speed printing turnaround and little waste generation. Two common methods used to form images on cylindrical objects using inkjet printing in the past were direct printing method and transfer method.

In direct printing method inkjet printing on 3D or cylindrical objects can be achieved either by moving the printhead or the object; however, the stationary printhead configuration limits the size and shape of the objects to be moved conveniently under the printheads. In the case of moving printheads, the printheads need to be moved over the object, or the object under the printheads, such that a path following the shape of the object is traced out. The challenge here is to find an accurate robot motion system that can move the printhead with sufficient accuracy and repeatability to allow images or multiple dots, i.e. print swathes, to be aligned. Most robot systems define an accuracy with which they can move to a certain point in three dimensions rather than the accuracy and uniformity with which they can trace the path required for printing.

In transfer method an image is printed on an intermediate medium such as paper and is then transferred onto a final substrate using heat, pressure and/or by using release layers. The imaged transfer paper is placed over the cylindrical object with the image facing down. Then, the back surface of the paper is heated with a hand iron or pressed to release the image from the paper onto the cylinder. After completely transferring the image onto the cylinder, the paper is removed. In some cases, additional coatings called release layers are coated such that they can easily be peeled off leaving the image on the final substrates. The weakness of this approach is that the use of heat and pressure on the ink affects the image resolution.

Although there a numerous processes for forming images on three dimensional objects, there is still a need for a method which substantially reduces or eliminates the problems of forming images on three dimensional substrates as mentioned above.

SUMMARY OF THE INVENTION

Methods include: selectively inkjetting a resist composition including one or more waxes, one or more acrylate functional monomers free of acid groups and one or more radical initiators adjacent a first surface of an actinic radiation transparent flexible film; applying the actinic radiation transparent flexible film with the resist composition to a surface of a three dimensional substrate, the first surface of the actinic radiation transparent flexible film with the resist composition adjacent the surface of the three dimensional substrate and the actinic radiation transparent flexible film follows contours of the surface of the three dimensional substrate; applying actinic radiation to a second surface of the actinic radiation transparent flexible film opposite the first surface with the resist composition to cure the resist composition; and separating the actinic radiation transparent flexible film from the cured resist composition with the cured composition adhering to the surface of the three dimensional substrate.

The methods enable image formation on three dimensional substrates using actinic radiation with improved resolution and speed in contrast to many conventional imaging processes used in imaging three dimensional substrates. Accordingly, the features on the substrate may be finer, smaller and increased in number. This is highly desirable as various industries which use inkjet imaging for formation of surface features are emphasizing miniaturization. Substantially all of the resist composition is released from the actinic radiation transparent flexible film to the surface of the three dimensional substrate without application of heat and/or excessive pressure which may distort the image or a release agent on the actinic radiation transparent flexible film. The methods provide more efficient imaging of three dimensional substrates than many conventional processes due to reduced processing steps and use of apparatus. The methods may be used in the manufacture of components of electronic devices, such as printed circuit boards and lead frames, optoelectronic devices, photovoltaic devices, in the metal finishing of parts and precision tooling.

BRIEF DESCRIPTION OF THE DRAWING

FIGURE is a schematic of a method of transferring a selectively applied inkjet image from an actinic radiation transparent flexible film to a three dimensionally curved substrate.

DETAILED DESCRIPTION OF THE INVENTION

As used throughout this specification, the following abbreviations have the following meanings, unless the context indicates otherwise: ° C.=degrees Centigrade; g=grams; L=liters; mL=milliliters; cm=centimeters; µ=µm=microns; dm=decimeters; m=meters; W=Watts=Amps×Volts; mJ=milliJoules; $A/dm^2$=amps per decimeter squared; DI=deionized; wt %=percent by weight; cP=centipoise; UV=ultraviolet; rpm=revolutions per minute; 2.54 cm=1 inch; PCB=printed circuit board or printed wiring board; 3D=three dimensional; KOH=potassium hydroxide; ASTM=American Standard Testing Method; kV=kilovolts; and psi=pounds/inch=0.06805 atmospheres=$1.01325 \times 10^6$ dynes/$cm^2$ "Actinic radiation" means electromagnetic radiation that can produce photochemical reactions. "Viscosity"=internal fluid friction or the ratio of the shear stress to the rate of shear of a fluid. "Acid value or acid number"=milligrams of potassium hydroxide required to neutralize 1 gm of free acid, and to measure the free acid present in a substance. "Moiety" means a specific group of atoms in a molecule. "Adjacent" means adjoining or contacting; All percentages are by weight, unless otherwise noted. All numerical ranges are inclusive and combinable in any order, except where it is logical that such numerical ranges are constrained to add up to 100%.

Resist compositions including one or more waxes, one or more acrylate functional monomers free of acid groups and one or more radical initiators are selectively applied by inkjet to one side of actinic radiation transparent flexible films. The transparent flexible films are planar during inkjet application. The flexible films with the inkjetted resist compositions are then applied to surfaces of three dimensional substrates such that the side of the films which include the resist compositions is adjacent to the surfaces of the three dimensional substrates and the resist compositions contact the surfaces of the substrates, the flexible films and the resist compositions follow the contours of the substrates. Actinic radiation is applied to the flexible films on the sides which are free of the resist compositions and the resist compositions cure and adhere to the surfaces of the substrates. The films are removed and the cured resist compositions remain on the surfaces of the three dimensional substrates. Substantially all of the resist compositions are transferred to the surfaces of the three dimensional substrates. The combination of the actinic radiation transparent flexible films and the curable resist compositions allow rapid application of the resists to three dimensional substrates, curing and formation of patterns on the three dimensional substrates which form intimate contact with the contours of the three dimensional substrates. Accordingly, the substrates may be of various shapes and sizes which include, but are not limited to: curved objects in general, cylinders, both solid and hollow, cones, triangular shaped objects, ellipses such as spheres, multi-faced articles and other irregular shaped objects. In addition, the surfaces of the three dimensional substrates may have irregularities on their surfaces which compromise pattern formation, such as the continuity of the pattern, when using many conventional processes. The combination of the flexibility and transparency of the films and adhesive properties of the resists enables the formation of continuous patterns on the irregular surfaces which follow the contours of the surfaces with reduced probability of the disruption of the patterns. Thus the methods are useful for formation of current patterns and other components of electronic devices on irregular shaped substrates. As the electronics industry focuses on miniaturization of electronic devices, substrates containing circuitry are necessarily miniaturized. The smaller the substrate the more accentuated the surface irregularities become. In other words, the surfaces of the miniaturized substrates are less planar. Also, since the substrates themselves are not conventionally shaped panels, typical of conventional printed circuit boards, the ability to form circuits on irregular shaped substrates provides additional flexibility for the electronics industry to use unconventionally shaped substrates for electronic devices, such as where space may be both limited and irregular.

Actinic radiation transparent and flexible films include, but are not limited to: polymer materials such as polyvinyl alcohols, polyesters, polyethylene terephthalates, polyimides, polyolefins, polycarbonates, polyacrylates and ethylvinylacetates. Preferably such films are transparent to UV light. The films have flexibility and dimensions to cover 3D objects of different shapes and sizes.

The combination of one or more acrylate monomers, one or more waxes and one or more radical initiators provides compositions which when cured may be used as a resist, such as an etch resist or a plating resist, and at the same time are strippable from the three dimensional substrates using base strippers such that substantially all of the cured resist composition is removed from the substrate. The net acid number of the compositions ranges from 0 mg KOH/g or greater, typically from 0-170 mg KOH, preferably from 0-100 mg KOH, more preferably from 0-30 mg KOH/g, most preferably from 0-20 mg KOH/g. The cured compositions are resistant to acid etchants, such as hydrofluoric acid, nitric acid, sulfuric acid, phosphoric acid, organic acids, such as carboxylic acids and mixtures thereof, and to industrial etches such as cupric chloride ($CuCl_2$) and ferric chloride ($FeCl_3$) and alkaline etchants such as ammoniacal etchants, ammonium hydroxide, ammonium chloride and ammonium sulfate. The compositions are readily stripped from the three dimensional substrates using base strippers such as organic amines which include alkanolamines, alkali metal hydroxides, which include potassium, sodium and mixtures thereof, and alkali carbonates and bicarbonates. The pH of the base may range from 8 or greater. Preferably, the pH is 11 or greater.

The resist compositions are substantially hot melt inks and are free of organic solvents as well as water. This means that no additional solvents or water are included in the compositions and only trace amounts of solvents or water may be present as impurities or as by-products in the manufacture of various components used to make the compositions. Preferably, the compositions are 100 wt % solids. They are low flowing, thus they form printed dots with aspect ratios (height to width) in the range of 0.05 to 0.25, or such as from 0.08 to 0.18. They also form images having good image definition.

Viscosities of the compositions are such that they may be used with many conventional inkjet apparatus. Typically, the viscosities of the compositions range from 4 cPs to 80 cPs from 40° C. to 150° C. Preferably the viscosities range from 8 cPs to 12 cPs from 85° C. to 90° C. Viscosity may be measured by conventional methods but is typically measured using a Brookfield viscometer with a rotating spindle, for example a number 18 spindle or a CP-42 spindle.

The one or more acrylates are free of acid groups and include, but are not limited to those which are commercially available under the Sartomer™, Actilane™ and Photomer™ trademarks, such as Sartomer™ 306 (tripropylene glycol diacrylate), Actilane™ 430 (trimethylol propane ethoxylate triacrylate), Actilane™ 251 (a tri-functional acrylate oligomer), Actilane™ 411 (a CTF acrylate), Photomer™ 4072 (trimethylol propane propoxylate triacrylate), Photomer™ 5429 (a polyester tetra-acrylate) and Photomer™ 4039 (a phenol ethoxylate monoacrylate). Sartomer™, Actilane™ and Photomer™ are trademarks of Cray Valley Inc., Akros BV and Cognis Inc., respectively. Other examples of monomers are lauryl acrylate, isodecylacrylate, isooctyl acrylate, butyl acrylate, 2-hydroxy ethyl acrylate, 2-hydroxy propylacrylate, 2-ethyl hexyl acrylate, 1,6-hexanediol diacrylate, neopentyl glycol diacrylate, diethylene glycol diacrylate, butanediol diacrylate, trimethylolpropane triacrylate, pentaerythritol triacrylate, 1,3-butyleneglycol diacrylate, 1,4-butylene glycol diacrylate, triethylene glycol diacrylate, pentaerythritol tetra acrylate, tripropylene glycol diacrylate, phenoxyethyl acrylate and tetra hydrofurfuryl acrylate. Additional acrylates which are free of acid groups are non-aromatic cyclic (alkyl)acrylates which include, but are not limited to: monocyclic, bicyclic, tricyclic and tetracyclic alicyclic (alkyl)acrylates having a bridged skeleton such as adamantine, norbanane, tricyclodecane and tetracyclododecane, and alicyclic hydrocarbon groups without a bridged skeleton which include but are not limited to cycloalkane such as cyclobutane, cyclopentane, cyclohexane, cycloheptane and cyclooctane. Cyclic structures also include non-aromatic heterocyclic groups such as furan. Examples of commercially available cyclic (alkyl)acrylates are tricyclodecane acrylate, isobornyl cyclohexyl acrylate, isobornyl cyclohexyl methacrylate, 3,3,5 trimethylcyclohexyl methacrylate, dicyclopentadienyl methacrylate, tetrahydrofurfuryl acrylate, tetrahydrofurfuryl methacrylate, cyclic trimethylpropane dimethylacrylate, cyclohexane dimethanol dimethacrylate, cyclic trimethylopropane formal acrylate, 2-norbornyl acrylate and tricyclodecane dimethanol diacrylate. Many of the commercially available cyclic (alkyl) acrylates may be obtained from Cray Valley Inc., Akros BV or Cognis Inc. Preferably the acrylates are one or more of the non-aromatic cyclic (alkyl)acrylates.

The acrylates are included in the resist compositions in amounts of 30 wt % or greater, preferably 30 wt % to 80 wt % of the composition. More preferably the acrylates are included in the resist compositions in amounts of 40 wt % to 60 wt %. When one or more non-aromatic cyclic (alkyl) acrylates are combined with one or more acrylate monomers which are not non-aromatic cyclic (alkyl)acrylates, the one or more non-aromatic cyclic (alkyl)acrylates are preferably included in the compositions in amounts of 40 wt % to 60 wt %.

One or more waxes which provide desired etch or plating resistance, flow, definition and stripping ability are included in the compositions. Both acid and non-acid waxes may be included. Acid functionality of the compositions is substantially limited to the acid waxes. Acid functionality is measured in mg KOH/g of the wax. Waxes which have acid numbers of 0-1 mg KOH/g are typically considered non-acid waxes. High acid waxes and low acid waxes and mixtures thereof may be used. The term "high acid waxes" means a wax that has an acid content of 50 mg KOH/g or greater and are 50% or greater acid functionalized. Preferably, the high acid waxes have an acid content of 100 mg KOH/g or higher, more preferably an acid content of 120 mg KOH/g to 170 mg KOH/g. The term "low acid waxes" means a wax that has an acid value of less than 50 mg KOH/g or less and are less than 50% acid functionalized. The "low acid waxes" include the non-acid waxes because their acid values typically fall near or within the 0-1 mg KOH/g range. One or more acid waxes and non-acid waxes may be blended together to achieve a desired acid value.

Acid waxes are typically acid-containing crystalline polymeric waxes. The term "crystalline polymeric waxes" means a wax material that contains an ordered array of polymer chains within a polymer matrix which can be characterized by a crystalline melting point transition temperature ($T_m$). The crystalline melting temperature is the melting temperature of the crystalline domains of a polymer sample. This is in contrast to glass transition temperature ($T_g$) which characterizes the temperature at which polymer chains begin to flow for the amorphous regions within a polymer.

Carboxylic acid-terminated polyethylene waxes which may be used in the compositions include, but are not limited to: mixtures of carbon chains with the structure $CH_3$—$(CH_2)_{n-2}$—COOH, where there is a mixture of chain lengths, n, where the average chain length is from 16 to 50 and linear low molecular weight polyethylene, of similar average chain length. Examples of such waxes include, but are not limited to, UNICID® 550 with n equal to 40, and UNICID® 700 with n equal to 50. Both are available from Baker Petrolite, (U.S.A.). UNICID® 550 includes 80% carboxylic acid functionality with the remainder a linear, low molecular weight polyethylene of a similar chain length, and an acid value of 72 mg KOH/g and a melting point of 101° C. Other examples of waxes have a structure of $CH_3$—$(CH_2)_n$—COOH, such as hexadecanoic or palmitic acid with n=16, heptadecanoic or margaric or daturic acid with n=17, octadecanoic or stearic acid with n=18, eicosanic or arachidic acid with n=20, docosanoic or behenic acid with n=22, tetracosanoic or lignoceric acid with n=24, hexacosanoic or cerotic acid with n=26, heptacosanoic or carboceric acid with n=26, heptacosanoic or carboceric acid with n=27, octacosanoic or montanic acid with n=28, triacontanoic or melissic acid with n=30, dotriacontanoic or lacceroic acid with n=32, titriacontanoic or ceromelissic or psyllic acid with n=33, tetratriacontanoic or geddic acid with n=34, pentatriacontanoic or ceroplastic acid with n=35.

Examples of other high acid waxes which are included in the compositions are high acid waxes with linear aliphatic chains of 16 and more carbon atoms. Typically, linear saturated, aliphatic waxes having an end-functionalized carboxylic acid are used. Such waxes have an acid value greater than 50 mg KOH/g. More typically, such high acid waxes are a montan wax, n-octacosanoic acid, $CH_3$—$(CH_2)_{26}$—COOH, 100% acid functionalized. Such waxes include, but are not limited to, Licowax® S, manufactured by Clariant GmbH (Germany), with an acid value of 127 to 160 mg KOH/g, Licowax® SW with acid values of 115 to 135 mg KOH/g, Licowax® UL with an acid value of 100 to 115 mg KOH/g and Licowax® X101 with acid values of 130 to 150 mg KOH/g. Other suitable high acid waxes include partly esterified montanic acid waxes, where some of the acid termination has been esterified, such as Licowax® U with an acid value of 72 to 92 mg KOH/g.

Waxes which have an acid number of less than 50 mg KOH/g, preferably from 0 to 30 mg KOH/g include, but are not limited to: waxes of plant origin such as candelilla wax and carnuba wax, petroleum waxes such as paraffin wax or microcrystalline wax, mineral waxes such as esterified montan waxes, ozokerite, bees wax and ceresin waxes, synthesized hydrocarbon waxes such as Fischer-Tropsch wax, hydrogenated waxes such as hardened castor oil and fatty acid esters. Such waxes typically contain mainly hydrocarbons or esterified waxes. In general such waxes may include 40%-80% by weight hydrocarbons or esterified waxes or mixtures thereof. Commercially available examples of such waxes are SP-75 from Strahl & Pitsch, Inc. (candelilla wax), SP1026 and SP319 also from Strahl & Pitsch, Inc. (ceresin waxes), Paraffin Wax 1250 from The International Group, Inc. and LICOWAX® E Flake and LICOLUB® WM 31 both from Clariant (esterified montan waxes). Preferably waxes which have an acid number of less than 50 mg KOH/g are used in the resist compositions, more preferably waxes with acid numbers of 0-30 mg KOH/g are used.

When the resist compositions include one or more waxes having acid numbers of 100 mg KOH/g or greater with one or more waxes having acid numbers of 0-30 mg KOH/g, preferably, the high acid waxes have an acid number of 110 mg KOH/g to 250 mg KOH/g. Such waxes are 60% and greater acid functionalized, preferably 70% and greater. Such waxes are included in the resist compositions such that the weight ratio of the waxes having the acid numbers of 0 to 30 mg KOH/g to the waxes having acid numbers of 100 mg KOH/g or greater is from 1:1 to 5:1, preferably from 1:1 to 2:1. Preferably such resist compositions include one or more waxes with an acid number of 100 mg KOH/g or greater. Such waxes include, but are not limited to: LICO-WAX® S, manufactured by Clariant GmbH (Germany), with an acid value of 127 to 160 mg KOH/g, LICOWAX® SW with acid values of 115 to 135 mg KOH/g, LICOWAX® UL with an acid value of 100 to 115 mg KOH/g and LICOWAX® X101 with acid values of 130 to 150 mg KOH/g. Such waxes are high acid containing montan waxes or n-octacosanoic acid, $CH_3—(CH_2)_{26}—COOH$, 100% acid functionalized. Also, carboxylic acid-terminated polyethylene waxes such as myristic acid with acid numbers of 244-248 mg KOH/g, hexadecanoic and palmitic acid with acid numbers of 215-233 mg KOH/g and octadecanoic and stearic acid with acid numbers of 205-210 mg KOH/g may be included in preferred formulations.

The waxes disclosed above are included in the resist compositions in amounts of 0.5 wt % to 40 w % of the resist composition, preferably from 5 wt % to 30 wt %, more preferably from 5 wt % to 25 wt % of the composition.

In general, the melting points of the waxes disclosed above range from 65° C. to 150° C. Typically the melting points are from 80° C. to 110° C.

Radical initiators may be initiators including optional synergists which are typically used in the industry to initiate polymerization of acrylate functional monomers. The initiator and the synergist, when present may be activated by actinic radiation. Sources of actinic radiation include, but are not limited to: mercury lamps, xenon lamps, carbon arc lamps, tungsten filament lamps, light emitting diodes (LEDs), lasers, electron beam and sunlight. Preferably, the radical initiator is a photoinitiator activated by UV light.

Examples of radical initiators and synergists are anthraquinone, substituted anthraquinones such as alkyl and halogen substituted anthraquinones such as 2-tertiary butyl anthraquinone, 1-chloroanthraquinone, p-chloroanthraquinone, 2-methylanthraquinone, 2-ethylanthraquinone, octamethyl anthraquinone and 2-amylanthraquinone, optionally substituted polynuclear quinones such as 1,4-naphthaquinone, 9,10-phenanthraquinone, 1,2-benzanthraquinone, 2,3-benzanthraquinone, 2-methyl-1,4-napththoquinone, 2,3-dichloronaphthaquinone, 1,4-dimethylanthraquinone, 2,3-dimethylanthraquinone, 2-phenylanthraquinone, 2,3-diphenylanthraquinone, 3-chloro-2-methylanthraquinone, retenequinone, 7,8,9,10-tetrahydronaphthaanthraquinone, 1,2,3,4-tetrahydrobenzanthracene-7,2-dione, acetophenones such as acetaphenone, 2,2-dimethoxy-2-phenyl acetophenone, 2,2-diethoxy-2-phenyl acetophenone, 1,1-dichloro acetophenone, 1-hydroxy cyclohexyl phenylketone and 2-methyl-1-(4-methylthio)phenyl-2-morpholin-propan-1-one; thioxanthones such as 2-methylthioxanthone, 2-decylthioxanthone, 2-dodecylthioxanthone, 2-isopropylthioxanthone, 2,4-dimethylthioxanthone, 2,4-diethylthioxanthone, 2-chlorothioxanthone and 2,4-diisopropylthioxanthone; ketals such as acetophenone dimethylketal and dibenzylketal; benzoins and benzoin alkyl ethers such as benzoin, benzylbenzoin methyl ether, benzoin isopropyl ether and benzoin isobutyl ether; azo compounds such as azobisisovaleronitrile; benzophenones such as benzophenone, methylbenzophenone, 4,4-dichlorobenzophenone, 4,4-bis-diethyl amino benzophenone, Michler's ketone and xanthone, and mixtures thereof. Examples of commercial initiators and synergists are Speedcure™ ITX, EHA and 3040, Irgacure™ 184, 369, 907 and 1850, Daracure™ 1173. Speedcure™, Irgacure™ and Daracure™ are registered trademarks of Lambson Plc and Ciba GmbH, respectively.

Radical initiators are included in sufficient amounts to enable curing of the compositions upon exposure to actinic radiation. Typically, such radical initiators are included in amounts of 0.1 wt % to 10 wt % of the composition, preferably from 1 wt % to 5 wt % of the composition.

Optionally, one or more colorants may be included in the resist compositions. Such colorants include pigments and dyes including fluorescing dyes. Colorants may be included in the compositions in conventional amounts to provide a desired color contrast. Suitable pigments include, but are not limited to: titanium dioxide, Prussian blue, cadmium sulfide, iron oxides, vermillion, ultramarine and the chrome pigments, including chromates, molybdates and mixed chromates and sulfates of lead, zinc, barium, calcium and mixtures and modifications thereof which are commercially available as greenish-yellow to red pigments under the names primrose, lemon, middle orange, scarlet and red chromes.

Suitable dyes include, but are not limited to, azo dyes, metal complex dyes, Naphthol dyes, anthraquinone dyes, indigo dyes, carbonium dyes, quinoneimine dyes, xanthene dyes, cyanine dyes, quinoline dyes, nitro dyes, nitroso dyes, benzoquinone dyes, naphthoquinone dyes, penoline dyes, pthalicyanine dyes and leuco dyes. Examples of fluorescent dyes are xanthenes such as rhodamine and fluorescein, bimanes, coumarins such as umbelliferone, aromatic amines such as dansyl, squarate dyes, benzofurans, cyanines, merocyanines, rare earth chelates and carbozoles.

Additional optional conventional additives include, but are not limited to, surfactants such as non-ionic, cationic, anionic and amphoteric, slip modifiers, thioxtropic agents, foaming agents, anti-foaming agents, plasticizers, thickeners, binders, antioxidants, photoinitiator stabilizers, gloss agents, fungicides, bactericides, organic and inorganic filler particles, leveling agents, opacifiers, antistatic agents and metal adhesion agents. Such optional additives may be included in conventional amounts.

The resist compositions may be prepared by any suitable method known in the art. The waxes, acrylate monomers and radical initiators which are included in the compositions typically are solids or semi-solids at room temperatures. They may be combined together in any order. They may be heated to soften or liquefy them such that they may be readily mixed together or with any additional components. Components may be combined in any order in a conventional mixing or homogenizing apparatus. Temperatures of above 25° C. to 150° C. typically are employed to mix the components. After the components are uniformly mixed the mixture may be cooled to 25° C. or below to form a solid hot melt composition.

The resist compositions are applied by inkjet. Inkjet apparatus may digitally store information in its memory for a selective resist design to be applied to a substrate. Examples of suitable computer programs are standard CAD (computer aided design) programs for generation of tooling data. Workers may readily modify the selective deposition of the compositions by changing the program digitally stored in the ink jet apparatus. Additionally, registration problems also may be readily addressed. The inkjet apparatus may be programmed to perceive potential incorrect alignment between substrates, such as in the manufacture of multi-layer PCBs. When the apparatus senses misregistration between boards, the program modifies the inkjet application of the resist mask pattern to avoid or correct misregistration between adjacent boards. The ability to re-design the pattern from board to board reduces the potential for misregistration between the boards, and eliminates the costly and inefficient task of preparing multiple fixed phototools. Accordingly, efficiency of selective deposition of the resist and image formation is improved over many conventional methods.

There are two major categories of inkjet printing, "Drop-On-Demand" inkjet and "Continuous" inkjet. Using Drop-On-Demand inkjet technology the resist composition is stored in a reservoir and delivered to a nozzle in the print head of the printer. A means exists to force a single drop of composition out of the nozzle and onto a substrate. Typically this is a piezo electric actuation of a diaphragm within a chamber, which "pumps" the droplets out of the nozzles, or a localized heating of the fluid to increase the pressure within the chamber, thus forcing a droplet to eject.

In "continuous" inkjet printing, a continuous stream of hot melt resist composition is delivered to a nozzle in the print head of the printer. Prior to passing out of the nozzle, the pressurized composition stream proceeds through a ceramic crystal subjected to an electric current. This current causes a piezoelectric vibration equal to the frequency of AC (alternating current) electric current. This vibration, in turn, generates droplets of the composition from the unbroken stream. The composition breaks up into a continuous series of drops, which are equally spaced and of equal size. Surrounding the jet at the point where the drops separate from the liquid stream in a charge electrode a voltage is applied between the charge electrode and the drop stream. When the drops break off from the stream, each drop carries a charge proportional to the applied voltage at the instant at which it breaks off. By varying the charge electrode voltages at the same rate as drops are produced every drop may be charged to a predetermined level. The drop stream continues its flight and passes between two deflector plates, which are maintained at a constant potential such as +/−0.1 kV to +/−5 kV, or such as +/−1 kV to +/−3 kV. In the presence of this field, a drop is deflected towards one of the plates by an amount proportional to the charge carried. Drops, which are uncharged, are undeflected and collected into a gutter to be recycled to the ink nozzle. Drops which are charged and hence deflected impinge on a radiant energy sensitive material traveling at right angles to the direction of drop deflection. By varying the charge on individual drops, a desired pattern can be applied. Drop sizes may range from 30 µm to 100 µm, or such as from 40 µm to 80 µm, or such as from 50 µm to 70 µm in diameter.

The inkjet processes are adaptable to computer control for high-speed application of continuously variable data. Inkjet printing methods may be divided into three general categories: high pressure (10 psi and greater), low pressure (less than 10 psi) and vacuum techniques. All are known in the art or described in the literature and can be employed in the application of the resist compositions to substrates.

The resist compositions may be used as etch resists or as plating resists. The FIGURE is a schematic of inkjetting a pattern on a UV transparent film followed by application of the film with the pattern on the substrate. In step 1 a UV transparent flexible film 10 is provided and made planar. In step 2 a UV curable hot melt ink resist pattern 12 is applied to the UV transparent flexible film 10 with inkjet nozzle 14 from an inkjet apparatus (not shown). In step 3 the film with the hot melt ink resist is applied to a three dimensional curved substrate 16 such that the side of the film with the patterned resist contacts the surface of the substrate. In step 4 air is removed between the film 10 and the substrate 16 by gently pressing the film or by vacuum. In step 5 UV light 18 is applied to the UV transparent film on the side which does not include the UV curable resist but the resist is cured and adheres to the three dimensional curved substrate 16. In step 6 the foil is removed leaving the cured resist 20 on the substrate 16.

After curing, the three dimensional substrate with the cured resist may be etched to a desired depth or to remove sections of the substrate surface to expose underlying layers to form a pattern on the substrate. The etchant does not remove the cured resist from the substrate during etching, thus the cured resist composition functions as an etch resist. The etch resist is then stripped from the substrate leaving a patterned substrate for further processing by conventional methods known in the art. Also, the uncovered sections of the substrate may be plated with a metal to form a pattern on the substrate, thus the cured resist functions as a plating resist. The plating resist is then stripped from the substrate leaving a substrate with a metal pattern for further processing by conventional methods known in the art. Stripping is done with a base at pH 8 or greater, preferably, at pH 11 or higher. More preferably stripping is done with a base at pH 11 to 13. Stripping temperatures range from 0° C. to 100° C., typically from 40° C. to 60° C.

Etching may be done by methods known in the art appropriate to the material of which the substrate is composed. Typically, etching is done with acids, such as hydrofluoric acid, nitric acid, phosphoric acid, hydrochloric acid, organic acids, such as carboxylic acids and mixtures thereof and alkaline etchants such as ammoniacal etchants, ammonium hydroxide, ammonium chloride and ammonium sulfate. Industrial etchants such as cupric chloride ($CuCl_2$) and ferric chloride ($FeCl_3$) may be used.

Etching is typically done at temperatures of 20° C. to 100° C., more typically from 25° C. to 60° C. Etching includes spraying or dipping the resist coated substrate with the etchant in either a vertical or horizontal position. Typically, spraying is done when the substrate is in the horizontal position. This allows for quicker removal of the etchant. The speed of etching may be accelerated by agitating the etchant, for example, using sonic agitation or oscillating sprays. After the substrate has been treated with the etchant it is typically rinsed with water to remove traces of the etchant.

One or more metal layers may be deposited in the patterns formed on the substrate. Metals may be deposited electrolessly, electrolytically, by immersion or light induced plating. Conventional electroless, electrolytic, and immersion baths and methods may be used to deposit metal or metal alloy layers. Many such baths are commercially available or described in the literature. Metals include, but are not limited to, noble and non-noble metals and their alloys. Examples of suitable noble metals are gold, silver, platinum, palladium and their alloys. Examples of suitable non-noble metals are copper, nickel, cobalt, bismuth, zinc, indium, tin and their alloys.

The resist compositions have acid and alkaline resistance from pH 1 to a pH of less than 8. Preferably, the resist compositions have acid and alkaline resistance from pH 1 to a pH of less than 11. The resist compositions adhere to a variety of three dimensional surfaces may be rapidly stripped from the substrates with base strippers.

The methods enable image formation on three dimensional substrates with improved resolution in contrast to many conventional imaging processes used in imaging three dimensional substrates. Accordingly, the features on the substrate may be finer, smaller and increased in number. This is highly desirable as various industries which use inkjet imaging for formation of surface features are emphasizing miniaturization. Substantially all of the resist composition is released from the actinic radiation transparent flexible film to the surface of the three dimensional substrate without application of excessive pressure which may distort the image. In addition, release agents are not included on the actinic radiation transparent flexible films as in many conventional methods. The methods provide more efficient imaging of three dimensional substrates than many conventional processes due to reduced processing steps and use of apparatus. The methods may be used in the manufacture of components of electronic devices, such as printed circuit boards and lead frames, optoelectronic devices, photovoltaic devices, in the metal finishing of parts and precision tooling.

The following examples are intended to further illustrate the invention but are not intended to limit its scope.

Examples 1-4

The following inkjet etch resist compositions were prepared:

TABLE 1

|  | Examples | | | |
| --- | --- | --- | --- | --- |
|  | 1 | 2 | 3 | 4 |
| Monomers | | | | |
| Isobornyl acrylate | 48 wt % | | | |
| Dicyclopentadienyl methacrylate | | 50 wt % | | 50 wt % |
| Trimethylolpropane triacrylate | | | | 17 wt % |
| Polybutadiene diacrylate | | | 10 wt % | |
| Polybutadiene dimethacrylate | 12 wt % | | | |
| Tricyclodecane dimethanol diacrylate | | | 60 wt % | |
| Aliphatic urethane acrylate[1] | | | | 13 wt % |

TABLE 1-continued

|  | Examples | | | |
| --- | --- | --- | --- | --- |
|  | 1 | 2 | 3 | 4 |
| Plasticizers | | | | |
| Partially hydrogenated rosin resin[2] | 20 wt % | | | |
| Hydrogenated rosin resin[3] | | 20 wt % | | |
| Liquid rosin[4] | | | 20% | |
| Photoinitiators | | | | |
| Isopropyl thixanthone | 5 wt % | 5 wt % | 2% | 2.5 wt % |
| Hydroxycylohexyll phenyl ketone | 5 wt % | 5 wt % | 3% | 2.5 wt % |
| Waxes | | | | |
| Ceresin wax | 10 wt % | | | 7.5 wt % |
| Candelilla wax | | | 10 wt % | |
| Esterified Montan wax | | 10 wt % | | |
| Montan wax | | | | 7.5 wt % |
| Myristic acid | 10% | | | |
| Palmitic acid | | 10 wt % | | |
| Stearic acid | | | 5 wt % | |

[1]EBECRYL ® 8309 Acrylic Ester from Cytec Industries
[2]STAYBELITE ® A typical composition and properties: abietic acid <3 wt %, dehydroabietic acid 6-10 wt %, dihydroabietic acid 60-80 wt %, tetrahydroabietic acid 5-15 wt %, other resin acids and neutrals 10-15 wt %, softening point, Ring & Ball, ° C. = 65-69, acid number 158-160
[3]Hercolyn Floral AX-E from Pinova solutions inc.
[4]Hercolyn D- Methyl Hydrogenated Rosinate from Pinova solutions inc.

All the formulations in Table 1 were prepared by the same method. The monomers, waxes, plasticizers and the photoinitiators were blended together using a conventional laboratory blending apparatus at room temperature. The formulations were 100% solids. The mixtures were then heated in a conventional convection oven within a temperature range of 85° C. to 90° C. The heated resists were then filtered through a conventional laboratory 1.5μ metal filter while still within the temperature range of 85° C. to 90° C. The viscosity of each ink was measured using a Brookfield viscometer with thermoset attachment with a CP-42 spindle. The viscosities of the resists ranged from 8 cPs to 12 cPs. The net acid numbers for the four inkjet resists were calculated to range from 0-20 mg KOH/g.

Example 5

The resist composition from Example 1 was selectively ink jetted from a piezoelectric drop-on-demand print head (Spectra™ SE-128) onto a UV transparent polyvinyl alcohol (PVA) film to form four separate straight line patterns. The PVA film was free of any release agent. The temperature during inkjetting was from 85° C. to 95° C. The thickness of each line ranged from 15 μm to 30 μm. The PVA film with the line patterns was then applied to four copper clad FR4/glass epoxy three dimensional curved panels having thicknesses of 15 μm to 30 μm. The PVA film was turned over such that the side of the film with the straight lines was applied to the surface of the panels such that each copper panel made contact with all of the four patterns. The film was gently pressed and squeegee against the panels to remove any air underneath the film and for the resist to stick to the panels. The panels with the PVA on the top were then passed underneath UV light varying from 250-1000 mJ/cm² using a Fusion D lamp running at 120 W/cm. The PVA film was then peeled from the panels. All the resists were cured and adhered to the panels. No resist was observed on the PVA film. Each panel was observed under an optical micro-scope at 5× and 10×. All of the lines appeared straight with no smudging or spreading around the edges of the lines.

Example 6

The method described in Example 5 is repeated with a plurality of copper clad FR4/glass epoxy three dimensional curved panels having thicknesses of 15 μm to 30 μm except the resist compositions are those prepared in Examples 2-4 above. The films are chosen from polyester, polyethylene terephthalate (PET), polyimide (PI), polyolefin, polycarbonate, polyacrylate and ethylvinylacetate. The films are free of any release agents. Each formulation is inkjetted on each UV transparent film to form a pattern using the apparatus and method described above in Example 5. The films with the resist compositions are then applied to the curved panels such that the resist comes in contact with the curved panels. Each film is gently pressed and squeegee against the panels to remove air and for the resist to stick to the panels. UV light is applied to the films and the films are peeled from the panels. All the resists are expected to be cured and adhere to the panels. No resist is expected to be seen on the films.

The panels are immersed in an ambient 10% sulfuric acid pre-dip for two minutes. Each panel with the cured resist is placed into a copper electroplating bath containing 80 g/L of copper sulfate pentahydrate, 225 g/L of sulfuric acid, 50 ppm of chlorine ions and 1 g/L polyethylene oxide. Electroplating is done at 1 A/dm². Copper metal is expected to deposit on the panels in sections not covered with the resist. Copper deposition is done until the copper deposit is 15 μm to 25 μm thick. Each panel is then dipped in a bath of aqueous stripping solution containing 15% tetramethyl ammonium hydroxide and 5% ammonia solution. The pH ranges from 11 to 12 at 45° C. Stripping is done for one minute. Substantially all of the resist is expected to be removed from the panels leaving copper circuit patterns on the panels which follow the contours of the surface of the panels.

Examples 7-13

TABLE 2

| Examples | 7 | 8 | 9 | 10 | 11 | 12 | 13 |
|---|---|---|---|---|---|---|---|
| MONOMERS | | | | | | | |
| Isobornyl acrylate | 40 wt % | | | | | 40 wt % | |
| Tripropylene glycol diacrylate | 45 wt % | | | 35 wt % | | | 80 wt % |
| Trimethylol propane ethoxylate triacrylate | | 50 wt % | | 45 wt % | 80 wt % | | |
| Butyl acrylate | | | 60 wt % | | | 50 wt % | |
| 2-hydroxy propylacrylate | | 30 wt % | 20 wt % | | | | |
| RADICAL INITIATORS | | | | | | | |
| Isopropyl thioxanthone | 2 wt % | | | | 10 wt % | 2.5 wt % | 5 wt % |
| Hydroxy cyclohexyl phenyl ketone | 3 wt % | | 2.5 wt % | 10 wt % | | 2.5 wt % | 5 wt % |
| 2-tertiary butyl anthraquinone | | 5 wt % | 2.5 wt % | | | | |
| Benzoin isopropyl ether | | 5 wt % | | | | | |
| ACID WAXES | | | | | | | |
| Montan wax | 8 wt % | | | 10 wt % | 10 wt % | | 10 wt % |
| Esterified montanic acid | | | 10 wt % | | | 5 wt % | |
| Palmitic acid | 2 wt % | | | | | | |
| Crystalline carboxylic acid terminated polyethylene wax | | 5 wt % | | | | | |
| Stearic acid | | 5 wt % | | | | | |

All seven resist formulations in Table 2 are prepared by the same method. The monomers, acid waxes and radical initiators are blended together to form a homogeneous mixture using conventional laboratory blending apparatus. Heating is done in a conventional convection oven at 50° C. to 90° C. to liquefy any components which are too solid to blend with the other components. After mixing each composition is then cooled to room temperature to form 100% solids compositions. The compositions are expected to have acid values of greater than 100 mg KOH/g.

Example 14

Each of the resists of Examples 7-13 are selectively applied to one of UV transparent films free of any release agents chosen from polyester, PET, PI, polyolefin, polycarbonate, polyacrylate and ethylvinylacetate using the piezoelectric drop-on-demand print head (Spectra™ SE-128) to form a pattern of lines on the films. The line thicknesses are from 15 μm to 30 μm. Each film with its resist pattern is applied to a three dimensional curved copper clad FR4/glass epoxy panel having thicknesses of 15 μm to 30 μm such that the side of the film which includes the resist contacts the panel. The films are gently pressed and squeegee against the panels to remove any air underneath the films and for the resist to stick to the panels. The panels with the films on the top are then passed underneath UV light varying from 250-1000 mJ/cm$^2$ using a Fusion D lamp running at 120 W/cm. The films are then peeled from the panels. All the resists are expected to be cured and adhere to the panels. No resist is expected to be observed on the films.

Each panel with the cured resist is placed into a copper electroplating bath containing 80 g/L of copper sulfate pentahydrate, 225 g/L of sulfuric acid, 50 ppm of chlorine ions and 1 g/L polyethylene oxide. Electroplating is done at 1 A/dm$^2$. Copper metal is expected to deposit on the panels in sections not covered with the resist. Copper deposition is done until the copper deposit is 15 μm to 24 μm thick. Each panel is then dipped into a bath of aqueous stripping solution of 2.5 wt % sodium hydroxide at 40° C. to 50° C. for one minute to strip the resist from the panels. Substantially all of the resist is expected to be removed from the panels leaving copper circuit patterns on the panels which follow the contours of the surface of the panels.

What is claimed is:

1. A method comprising:
   a. selectively inkjetting a 100% solids hot melt resist composition comprising one or more waxes, one or more acrylate functional monomers free of acid groups and one or more radical photoinitiators adjacent a first surface of an actinic radiation transparent flexible film to form a continuous pattern on the first surface of the actinic radiation transparent flexible film;
   b. applying the actinic radiation transparent flexible film with the 100% solids hot melt resist composition having the continuous pattern to a surface having irregularities of a three dimensional substrate, the first surface of the actinic radiation transparent flexible film with the 100% solids hot melt resist composition having the continuous pattern is adjacent the surface having irregularities of the three dimensional substrate, wherein the 100% solids hot melt resist composition contacts the surface having the irregularities and the actinic radiation transparent flexible film follows contours of the surface having irregularities of the three dimensional substrate;
   c. applying actinic radiation to a second surface of the actinic radiation transparent flexible film opposite the first surface with the 100% solids hot melt resist composition having the continuous pattern to cure the 100% solids hot melt resist composition, wherein the second surface of the actinic radiation transparent flexible film is free of the 100% solids hot melt resist composition; and
   d. separating the actinic radiation transparent flexible film from the cured 100% solids hot melt resist composition having the continuous pattern with the cured 100% solids hot melt resist composition having the continuous pattern adhering to the surface having irregularities of the three dimensional substrate.

2. The method of claim 1, further comprising etching sections of the three dimensional substrate not covered with the cured 100% solids hot melt resist composition having the continuous pattern.

3. The method of claim 2, further comprising plating metal on etched sections of the three dimensional substrate not covered with the cured 100% solids hot melt resist composition having the continuous pattern.

4. The method of claim 1, further comprising stripping the cured 100% solids hot melt resist composition from the surface having irregularities of the three dimensional substrate with a base having a pH of 8 or greater.

5. The method of claim 1, wherein the actinic radiation transparent flexible film is a polymer chosen from polyvinyl alcohols, polyesters, polyethylene terephthalates, polyimides, polyolefins, polycarbonates, polyacrylates and ethylvinylacetates.

6. The method of claim 1, wherein the one or more acrylate functional monomers free of acid groups are chosen from non-aromatic cyclic (alkyl)acrylates.

7. The method of claim 6, wherein the non-aromatic cyclic (alkyl)acrylates are chosen from monocyclic, bicyclic, tricyclic and tetracyclic alicyclic (alkyl)acrylates having a bridged skeleton and alicyclic hydrocarbon groups without a bridged skeleton.

8. The method of claim 1, wherein the 100% solids hot melt resist composition comprises an acid number of 0-170 mg KOH/g.

9. The method of claim 1, wherein the one or more waxes are chosen from candelilla waxes, paraffin waxes, esterified montan waxes, ozokerite waxes, ceresin waxes, synthesized hydrocarbon waxes, montan waxes, carboxylic acid-terminated polyethylene waxes, linear saturated aliphatic waxes having end functionalized carboxylic acid and hydrogenated waxes.

10. The method of claim 1, wherein the three dimensional substrate with the surface having irregularities is a solid cylinder, hollow cylinder, cone, triangular shaped object, ellipse or multi-faced article.

11. The method of claim 1, further comprising removing air between the actinic radiation transparent flexible film and the surface having irregularities of the three dimensional substrate.

12. The method of claim 1, wherein the actinic radiation transparent flexible film is free of release agents.

* * * * *